(12) United States Patent
Hu et al.

(10) Patent No.: US 12,176,451 B2
(45) Date of Patent: Dec. 24, 2024

(54) MOMENTUM-MATCHING AND BAND-ALIGNMENT VAN DER WAALS (VDW) INFRARED PHOTODETECTOR AND FABRICATION METHOD THEREOF

(71) Applicant: Shanghai Institute of Technical Physics of the Chinese Academy of Sciences, Shanghai (CN)

(72) Inventors: Weida Hu, Shanghai (CN); Zhen Wang, Shanghai (CN); Yunfeng Chen, Shanghai (CN); Jinshui Miao, Shanghai (CN); Peng Wang, Shanghai (CN); Fang Zhong, Shanghai (CN); Ting He, Shanghai (CN); Runzhang Xie, Shanghai (CN); Fang Wang, Shanghai (CN); Xiaoshuang Chen, Shanghai (CN); Wei Lu, Shanghai (CN)

(73) Assignee: Shanghai Institute of Technical Physics of the Chinese Academy of Sciences, Shanghai (CN)

( * ) Notice: Subject to any disclaimer, the term of this patent is extended or adjusted under 35 U.S.C. 154(b) by 377 days.

(21) Appl. No.: 17/808,662

(22) Filed: Jun. 24, 2022

(65) Prior Publication Data
US 2023/0420594 A1 Dec. 28, 2023

(51) Int. Cl.
*H01L 31/101* (2006.01)
*C23C 16/30* (2006.01)
(Continued)

(52) U.S. Cl.
CPC ........ *H01L 31/1013* (2013.01); *C23C 16/305* (2013.01); *H01L 31/0272* (2013.01); *H01L 31/18* (2013.01)

(58) Field of Classification Search
CPC .................................................. H01L 31/0272
See application file for complete search history.

(56) References Cited

PUBLICATIONS

"Self-Driven WSe2/Bi2O2Se Van der Waals Heterostructure Photodetectors with High Light On/Off Ratio and Fast Response" by Luo et al. (Year: 2021).*

(Continued)

*Primary Examiner* — Evren Seven
(74) *Attorney, Agent, or Firm* — SALIWANCHIK, LLOYD & EISENSCHENK

(57) ABSTRACT

The present disclosure provides a momentum-matching and band-alignment van der Waals (vdW) infrared photodetector and a fabrication method thereof. The photodetector includes a substrate, a dielectric layer, a $Bi_2O_2Se$ layer, a black phosphorus (BP) layer, a metal source and a metal drain. The fabrication method includes: transferring, in a wet manner, the $Bi_2O_2Se$ layer grown on the mica substrate onto the substrate having the dielectric layer, transferring the mechanically exfoliated BP layer through a micro-region fixed-point transfer device onto the $Bi_2O_2Se$ layer, and separately fabricating the metal source and the metal drain on the $Bi_2O_2Se$ layer and the BP layer by processes such as electron beam exposure and electron beam evaporation, thereby forming the momentum-matching and band-alignment vdW infrared photodetector having a vertical structure.

2 Claims, 5 Drawing Sheets

(51) Int. Cl.
*H01L 31/0272* (2006.01)
*H01L 31/18* (2006.01)

(56) References Cited

PUBLICATIONS

"Bi2O2Se/BP van der Waals heterojunction for high performance broadband photodetector" by Liu et al. (Year: 2021).*
"Construction of Bi2O2Se/Bi2Se3 Van Der Waals Heterostructures for Self-Powered and Broadband Photodetectors" by Yu et al. (Year: 2022).*

* cited by examiner

MOMENTUM-MATCHING AND BAND-ALIGNMENT VAN DER WAALS (VDW) INFRARED PHOTODETECTOR AND FABRICATION METHOD THEREOF

TECHNICAL FIELD

The present disclosure relates to momentum-matching and band-alignment van der Waals (vdW) infrared photodetectors, and in particular to a momentum-matching and band-alignment infrared photodetector and a fabrication method thereof, to implement the high external quantum efficiency (QE) and detectivity.

BACKGROUND ART

High-QE infrared photodetectors have been widely applied to such important fields as medical diagnosis, environmental monitoring and aerospace for the high sensitivity. The QE of the infrared photodetectors is limited by low energy of infrared photons and low absorptivity of narrow-bandgap materials. In order to overcome the problem, there are two solutions, namely using direct-bandgap semiconductors with the high absorptivity and applying a bias to the infrared photodetectors. Compared with indirect-bandgap semiconductors that involve phonons during transition, the direct-bandgap semiconductors show the higher absorptivity and thus can improve the QE of the device. For example, direct-bandgap InGaAs and HgCdTe commonly act as absorbers of short-wave infrared (SWIR) and medium-wave infrared (MWIR) photodetectors. The infrared photodetectors with these direct-bandgap materials have the high QE for a high gain under the applied bias. However, the device suffers a large dark current, a low response speed and a greatly reduced signal-to-noise ratio (SNR). The type-II band heterojunctions can effectively suppress the dark current and quickly separate photo-generated electron-hole pairs because of a built-in electric field. Nevertheless, due to surface dangling bonds and single band structures, infrared photodetectors with lattice-mismatching-immune interfaces and band-alignment are hardly achieved with the convention epitaxial growth.

Two-dimensional (2D) materials provide new opportunities for fabrication of novel infrared photodetectors, because they have naturally passivated surfaces and weak interlayer vdW forces and thus can be freely stacked into heterojunctions without further consideration of lattice-matching issues. However, due to the limited thickness and infrared absorption, the fabrication of the high-QE 2D material-based infrared photodetectors is a problem to be solved urgently. In view of this, the momentum-matching and band-alignment vdW infrared photodetector is provided. The band alignment means that the type-II band heterojunction is constructed to effectively separate the photo-generated electrons and holes, and to transport photo-generated electrons and holes without potential barriers between the valence band and conduction band. The momentum matching means that the valence-band maximum (VBM) of one semiconductor shares the same K-space with the conduction-band minimum (CBM) of another at the heterojunction. The momentum-matching heterojunction interfaces can support direct interlayer transition of the electrons in the same K-space to form strong interlayer coupling, thereby improving the transition of the photo-generated carriers, and obtaining the infrared photodetectors for highly-efficient charge transport and collection.

The present disclosure provides a momentum-matching and band-alignment vdW infrared photodetector. Black phosphorus (BP) is the direct-bandgap and narrow-bandgap 2D material, and shows a great potential in high-sensitivity infrared photodetection. The VBM of the 2D BP and the CBM of the 2D $Bi_2O_2Se$ share the same F point in the K-space. With infrared illumination on the BP/$Bi_2O_2Se$ vdW heterojunction, electrons in the valence band of the BP are excited into the conduction band of the $Bi_2O_2Se$, thereby forming interlayer transition and transport between BP and $Bi_2O_2Se$. Moreover, an ideal type-II band structure is formed between the BP and the $Bi_2O_2Se$, without the barrier for the transport of the electrons and holes. The momentum-matching and band-alignment vdW infrared photodetector shows the quantum efficiency of 84% at 1.3 μm illumination and 76.8% at 2 μm illumination, and the room-temperature detectivity of $1.14\times10^{10}$ cm $Hz^{1/2}$ $W^{-1}$.

SUMMARY

The present disclosure provides a momentum-matching and band-alignment vdW infrared photodetector and a fabrication method thereof, to implement the high room-temperature QE and detectivity.

The momentum-matching and band-alignment vdW heterojunction is introduced into the 2D material-based infrared photodetector. Based on the band structure and the momentum space, the detector improves the transition of the photo-generated carriers through the momentum matching, and transports the photo-generated carriers through the band alignment, thereby implementing the high room-temperature QE of the 2D material-based infrared photodetector.

The present disclosure provides a momentum-matching and band-alignment vdW infrared photodetector and a fabrication method thereof. The momentum-matching and band-alignment vdW infrared photodetector includes:
  a substrate 1;
  a dielectric layer 2;
  a $Bi_2O_2Se$ layer 3;
  a BP layer 4;
  a metal source 5; and
  a metal drain 6, where
  the substrate 1 is a heavily doped P-type silicon (Si) substrate;
  the dielectric layer 2 is $SiO_2$ and is 300 nm thick;
  the $Bi_2O_2Se$ layer 3 is 50-150 nm thick;
  the BP layer 4 is 10-50 nm thick;
  the metal source 5 is a titanium (Ti)-gold (Au) electrode, where Ti is about 10 nm thick on the $Bi_2O_2Se$ layer, and Au is 80 nm thick on the Ti; and
  the metal drain 6 is a Ti—Au electrode, where Ti is about 10 nm thick on the BP layer, and Au is 80 nm thick on the Ti.

The present disclosure provides a momentum-matching and band-alignment vdW infrared photodetector and a fabrication method thereof. The fabrication method of the infrared photodetector includes the following steps:
  1) growing the $Bi_2O_2Se$ layer on the mica substrate by chemical vapor deposition (CVD);
  2) transferring the $Bi_2O_2Se$ layer from the mica substrate onto the $SiO_2$ dielectric layer in a wet manner;
  3) mechanically exfoliating the BP layer from a BP crystal, and transferring the BP layer through a micro-region fixed-point transfer device onto a surface of the $Bi_2O_2Se$ layer, the other end of the BP layer covering the $SiO_2$ dielectric layer; and 4) separately depositing the Ti—Au source and the Ti—Au drain on ends of the transferred $Bi_2O_2Se$ layer and BP layer by processes such as polymethyl methacrylate (PMMA) photoresist coating, electronic beam exposure and exfoliation.

The momentum-matching and band-alignment structure is designed based on the 2D material. Because of no dangling bonds on the surface of the 2D material, there is a high-quality lattice-mismatching-immune interface between the $Bi_2O_2Se$ layer and the BP layer. A type-II band structure is formed between the $Bi_2O_2Se$ layer and the BP layer, without potential barriers between the conduction band and the valence band, which is favorable for separation and transport of the photo-generated electrons and holes. The VBM of the BP layer and the CBM of the $Bi_2O_2Se$ layer share the same F point in the K-space. When infrared photons have the energy larger than the bandgap energy of the $Bi_2O_2Se$ layer, and are illuminated onto the $Bi_2O_2Se$ and BP heterojunction device, electrons in the valence band of the BP layer can be excited into the conduction band of the $Bi_2O_2Se$ layer, thereby forming interlayer transition and transport. With the momentum matching, the present disclosure greatly improves the transition and absorption of the photons in the BP/$Bi_2O_2Se$ heterojunction, and thus improves the QE of the BP/$Bi_2O_2Se$ infrared photodetector. The momentum-matching and band-alignment BP/$Bi_2O_2Se$ infrared photodetector shows the QE of 84% at 1.3 μm illumination and 76.8% at 2 μm illumination, and the room-temperature detectivity of $1.14 \times 10^{10}$ cm $Hz^{1/2}$ $W^{-1}$.

The present disclosure has the following advantages: The momentum-matching and band-alignment vdW heterostructure based on the vertical structure works at a zero bias. With the momentum-matching between the BP layer and the $Bi_2O_2Se$ layer, the present disclosure greatly increases the photon transition and absorption coefficient of the light. Owing to the type-II band structure, the present disclosure separates and transports the photo-generated carrier without the barrier, and achieves the infrared photodetector with the high room-temperature QE. In addition, the BP/$Bi_2O_2Se$ device further has the characteristics of high sensitivity, wide band and polarization detection, and is greatly prosperous in room-temperature infrared imaging and polarization detection.

DETAILED DESCRIPTION OF THE EMBODIMENTS

The specific implementations of the present disclosure are described below in detail with reference to the accompanying drawings.

The present disclosure provides a momentum-matching and band-alignment infrared photodetector. With a special momentum-matching and band-alignment structure, the present disclosure can effectively improve the interlayer transition and transport of the photo-generated carriers, and obtain the device with the high QE and detectivity.

Specific Steps are as Follows:

1. Substrate selection

A heavily doped P-type Si substrate is selected, and a $SiO_2$ dielectric layer is about 300 nm thick.

2. Fabrication of a $Bi_2O_2Se$ layer and transfer of a BP layer

A $Bi_2O_2Se$ 2D material is grown on the mica substrate by CVD, and the $Bi_2O_2Se$ layer is transferred onto a $SiO_2$ dielectric layer on the substrate in a wet manner. In a nitrogen box, a BP layer is mechanically exfoliated, and transferred through a micro-region fixed-point transfer device onto the $Bi_2O_2Se$ layer. There is no contact between the BP layer and the $Bi_2O_2Se$ layer.

3. fabrication of a source and a drain of the infrared photodetector

A PMMA photoresist having a thickness of about 300 nm is coated on the substrate onto which the $Bi_2O_2Se$ layer and the BP layer are transferred. Electrode patterns on the $Bi_2O_2Se$ layer and the BP layer are accurately located and exposed by electron beam exposure. Exposed electrode patterns are developed. Metal electrodes on which Ti is 10 nm thick and Au is 80 nm thick are evaporated with an electron beam evaporation device. Unnecessary metal thin films are removed by soaking the metal electrodes in an acetone solution for 20 min to obtain the metal source and the metal drain.

Figure 2:
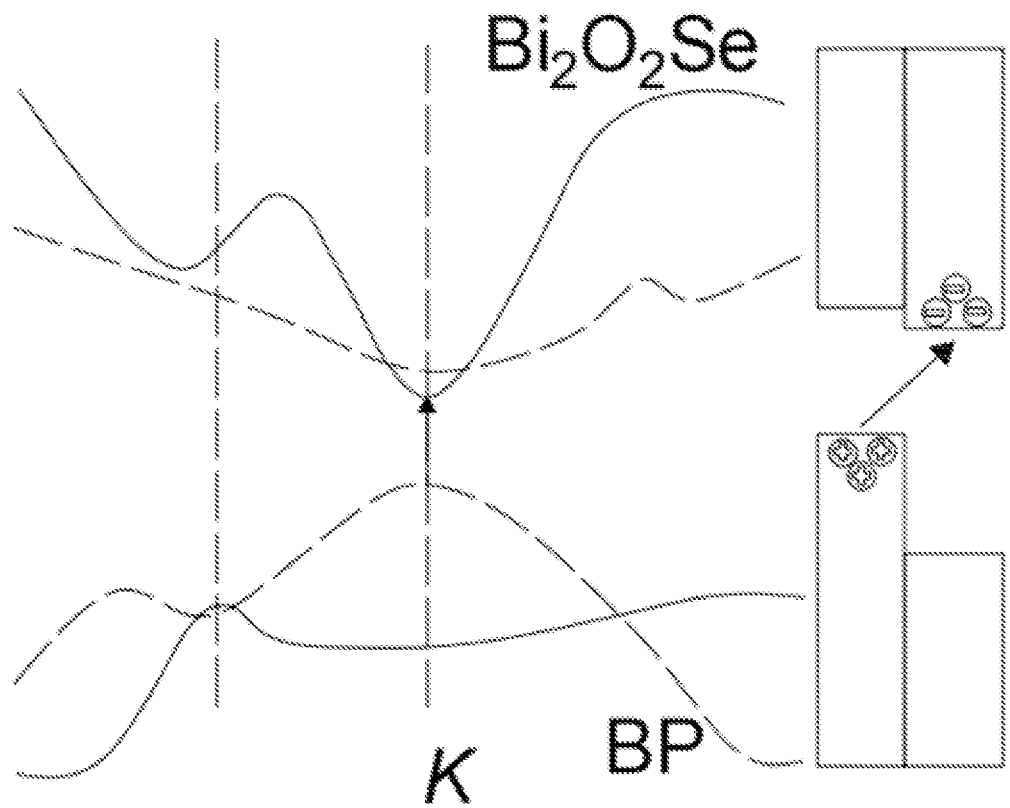
FIG. 2 illustrates a momentum-matching structure and a photoelectron transition process between a $Bi_2O_2Se$ layer and a BP layer.
Figure 3:
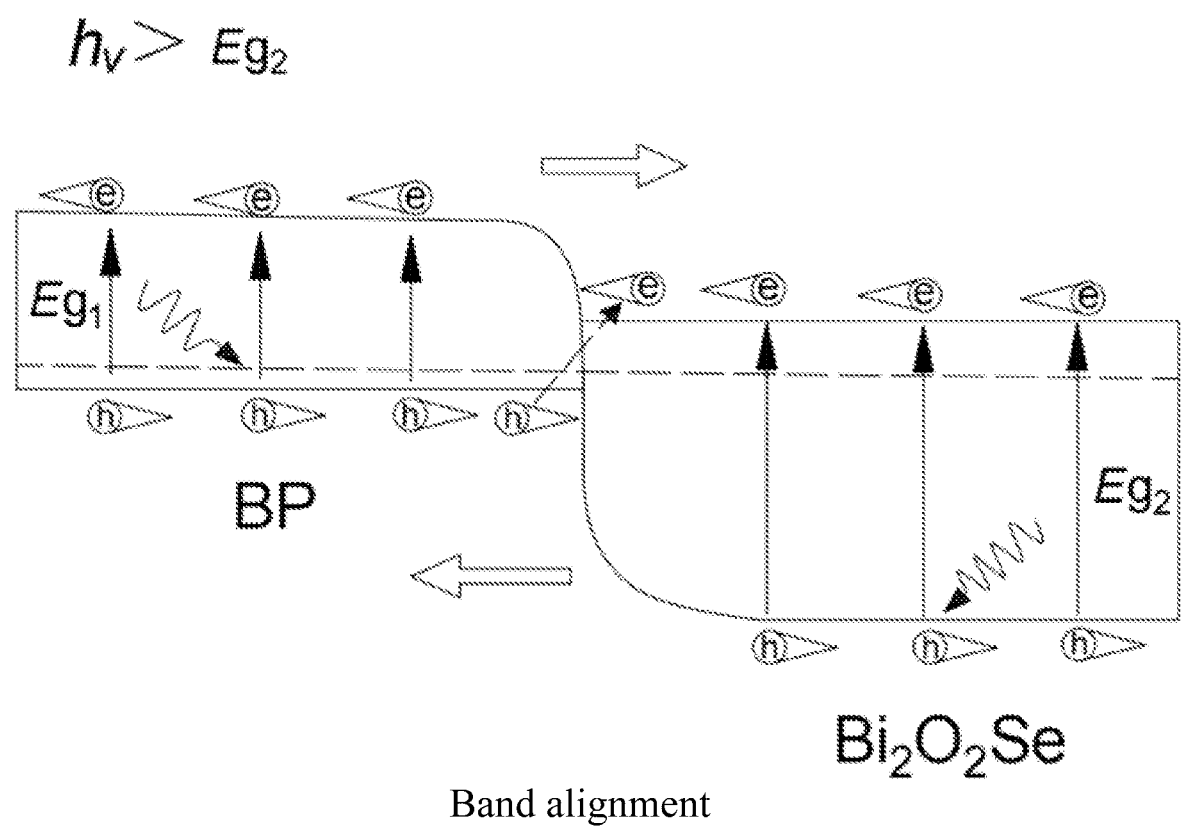
FIG. 3 illustrates a band-matching structure and a photoelectron transition process between a $Bi_2O_2Se$ layer and a BP layer.
Figure 4:
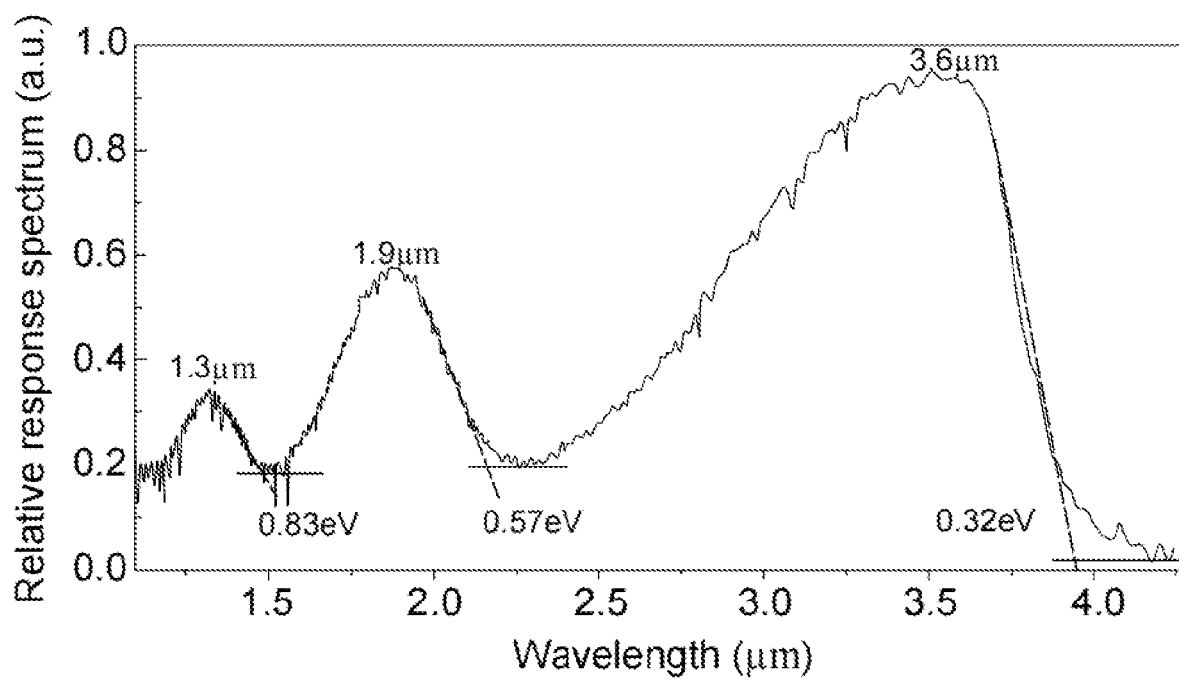
FIG. 4 illustrates a response spectrum of a BP/$Bi_2O_2Se$ infrared photodetector.
Figure 5:
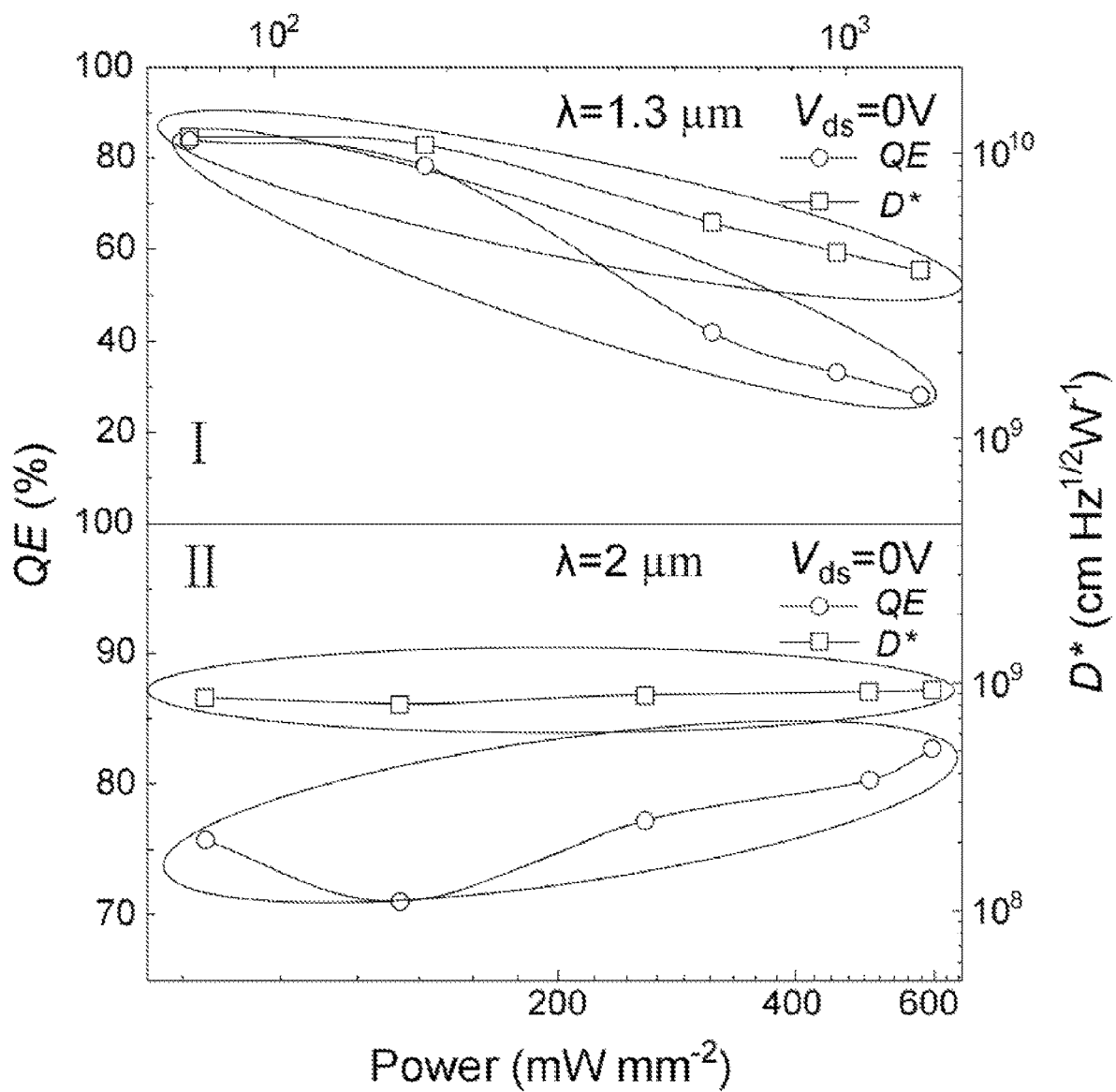
FIG. 5 illustrates a room-temperature QE and detectivity of a BP/$Bi_2O_2Se$ infrared photodetector at 1.3 μm and 2 μm.

4. Fabrication of two momentum-matching and band-alignment infrared photodetectors: First device: The substrate is the heavily doped P-type Si substrate. The $SiO_2$ dielectric layer is 300 nm thick. The $Bi_2O_2Se$ layer is 80 nm thick. The BP layer is 20 nm thick. The metal source is a Ti—Au electrode, where the Ti is about 10 nm thick on the $Bi_2O_2Se$ layer, and the Au is 80 nm thick on the Ti. The BP layer is 20 nm thick. The metal drain is a Ti—Au electrode, where the Ti is about 10 nm thick on the BP layer, and the Au is 80 nm thick on the Ti. Second device: The substrate is the heavily doped P-type Si substrate. The $SiO_2$ dielectric layer is 300 nm thick. The $Bi_2O_2Se$ layer is 120 nm thick. The BP layer is 30 nm thick. The metal source is a Ti—Au electrode, where the Ti is about 10 nm thick on the $Bi_2O_2Se$ layer, and the Au is 80 nm thick on the Ti. The BP layer is 20 nm thick. The metal drain is a Ti—Au electrode, where the Ti is about 10 nm thick on the BP layer, and the Au is 80 nm thick on the Ti. The above two devices show similar photoelectronic properties. The momentum-matching and band-alignment structures are as shown in FIG. 2 and FIG. 3 and the performance indicators are as shown in FIG. 4 and FIG. 5.

Figure 1:
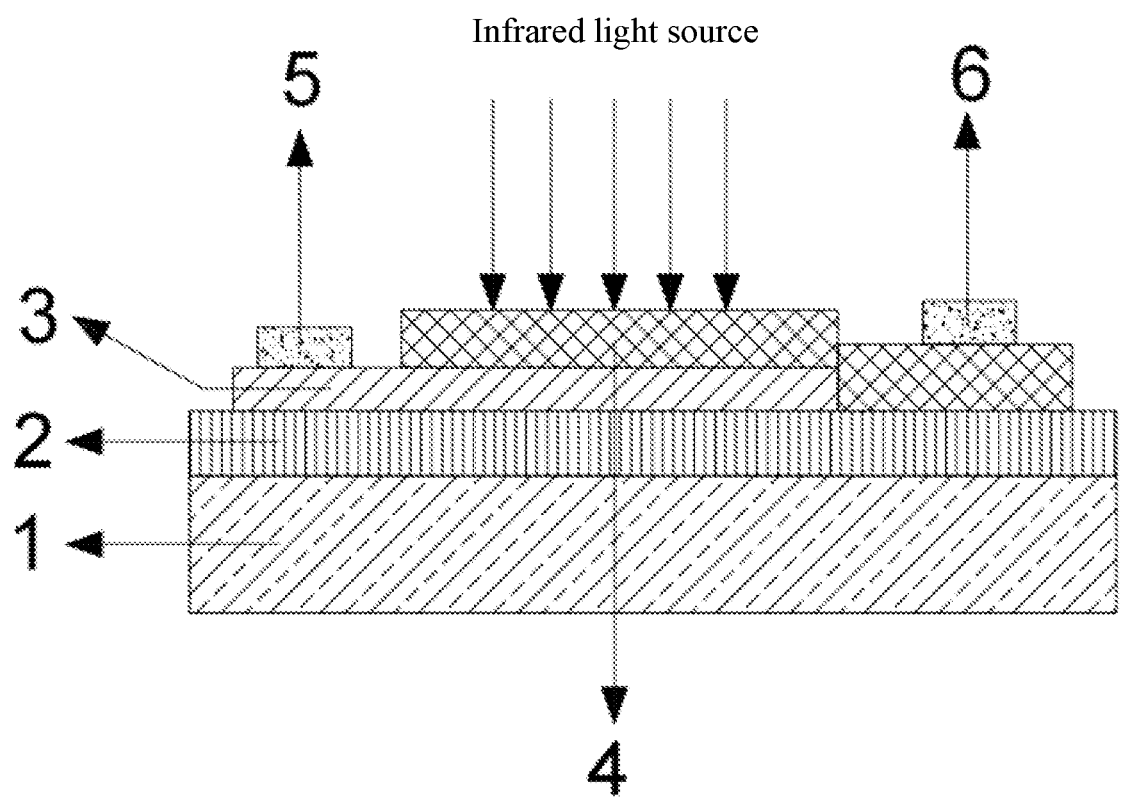
FIG. 1 illustrates a structural schematic view of a device. In the figure: 1. substrate, 2. dielectric layer, 3. $Bi_2O_2Se$ layer, 4. BP layer, 5. metal source, and 6. metal drain.

5. FIG. 1 illustrates a structural schematic view of a device. In the figure: 1. substrate, 2. dielectric layer, 3. $Bi_2O_2Se$ layer, 4. BP layer, 5. metal source, and 6. metal drain.

6. FIG. 2 illustrates a momentum-matching structure of an infrared photodetector under illumination. The VBM of the BP layer and the CBM of the $Bi_2O_2Se$ layer share the same F point in the K-space. Under infrared illumination, electrons in the valence band of the BP layer can be excited into the conduction band of the $Bi_2O_2Se$ layer, which greatly improves the transition and photon absorption of the photo-generated carriers.

7. FIG. 3 illustrates a band-matching structure of an infrared photodetector under illumination. The type-II bandgap structure is formed between the BP layer and the $Bi_2O_2Se$ layer. Under infrared illumination, photo-generated electrons and holes are excited. Due to the built-in electric field, the photo-generated carriers are separated quickly. Without potential barriers between the conduction band and the valence band in the type-II type band structure, the photo-generated electrons and holes are transported in valleys and collected by the source and drain electrodes.

8. FIG. 4 illustrates a relative response spectrum for a photocurrent detected by the infrared photodetector. 1.3 μm and 3.6 μm are bandgap response peaks for the $Bi_2O_2Se$ layer and the BP layer, respectively. 1.9 μm is an interlayer transition response peak between the $Bi_2O_2Se$ layer and the BP layer.

9. FIG. 5 illustrates a QE and a detectivity of the infrared photodetector at 1.3 μm illumination and 2 μm illumination. The infrared photodetector shows the QE of 84% and 76.8%, and the room-temperature detectivity of $1.14 \times 10^{10}$ cm $Hz^{1/2}$ $W^{-1}$.

What is claimed is:

1. A momentum-matching and band-alignment van der Waals (vdW) infrared photodetector, comprising:

a P-type silicon (Si) substrate, a SiO2 dielectric layer, a Bi2O2Se layer, a black phosphorus (BP) layer, a source and a drain, wherein the SiO2 dielectric layer is provided on the P-type Si substrate;

the Bi2O2Se layer covers the SiO2 dielectric layer;

the Bi2O2Se layer comprises one end covered by the BP layer, and the other end provided with the source; and the metal drain is located on the BP layer;

the substrate is a heavily doped P-type Si substrate;

the SiO2 dielectric layer is 300 nm thick; the Bi2O2Se layer is 50-150 nm thick;

the BP layer is 10-50 nm thick;

the metal source is a titanium (Ti)-gold (Au) electrode, wherein Ti is 10 nm thick on the Bi2O2Se layer, and Au is 80 nm thick on the Ti; and the metal drain is a Ti—Au electrode, wherein Ti is 10 nm thick on the BP layer, and Au is about 80 nm thick on the Ti.

2. A fabrication method of the momentum-matching and band-alignment van der Waals (vdW) infrared photodetector according to claim 1, comprising the following steps:

1) growing the Bi2O2Se layer on the mica substrate by chemical vapor deposition (CVD);

2) transferring the Bi2O2Se layer, prepared on the mica substrate by the CVD, onto the SiO2 dielectric layer in a wet manner;

3) mechanically exfoliating the black phosphorus (BP) layer from a BP crystal, and transferring the BP layer through a micro-region fixed-point transfer device onto a surface of the Bi2O2Se layer; and 4) separately depositing the titanium (Ti)-gold (Au) source and the Ti—Au drain on ends of the transferred Bi2O2Se layer and BP layer by polymethyl methacrylate (PMMA) photoresist coating, electronic beam exposure, or electron beam evaporation and exfoliation.

* * * * *